United States Patent [19]

Gordon

[11] 4,243,320

[45] Jan. 6, 1981

[54] METHODS FOR TESTING OPTICAL FIBRES

[75] Inventor: Kevin S. Gordon, Kanata, Canada

[73] Assignee: Northern Telecom Limited, Montreal, Canada

[21] Appl. No.: 22,433

[22] Filed: Mar. 20, 1979

[51] Int. Cl.³ ............................................. G01N 21/88
[52] U.S. Cl. ..................................... 356/73.1; 356/237
[58] Field of Search ................................ 356/73.1, 237

[56] References Cited

U.S. PATENT DOCUMENTS

| 4,012,149 | 3/1977 | Bouillie et al. | 356/237 |
| 4,070,118 | 1/1978 | Maslowski et al. | 356/237 |

Primary Examiner—Vincent P. McGraw
Attorney, Agent, or Firm—Stuart L. Wilkinson

[57] ABSTRACT

The invention uses the phenomenon of self-coupling by which light emitted from, and reflected back into, a laser produces self-coupling with consequent change in lasing activity. The invention proposes using the laser as a detector by inducing the self-coupling and monitoring the change in lasing activity. The invention enables fibre length, and the position of a reflective discontinuity in a fibre to be determined without the sophisticated and costly equipment required by current optical time domain reflectometry techniques.

3 Claims, 3 Drawing Figures

METHODS FOR TESTING OPTICAL FIBRES

This invention relates to a method for testing optical fibres, specifically for determining the length of the fibre, or the position of a reflective discontinuity in a fibre. The method finds particular applications in locating the position of a fibre break in a buried sheathed fibre optic telecommunications cable.

Known techniques for determining the signature, length or position of a break in a fibre have used the principle of optical time domain reflectometry (OTDR). A pulse is launched into the fibre and its time to return from a particular reflective discontinuity or to return as backscatter is measured. The technique uses a semiconductor laser, a coupler for coupling out the reflected signal, a high voltage photodetector, for example, a photomultiplier or avalanche photodiode, for monitoring reception of the reflected pulse, and accurate timing means. Such sophisticated equipment is costly and difficult to make robust in order to adapt it for the field.

An alternative technique proposed by this invention utilizes the phenomenon of self-coupling which is known to occur in semiconductor lasers. By this phenomenon light coupled into the laser can affect lasing activity. This occurs for example if the laser output, after passage along an optical path, returns to the laser as reflected or backscattered light.

Thus the invention proposes in its broadest aspect the use of a laser as a detector by inducing self-coupling and monitoring the consequent change in lasing activity.

In particular the invention provides a method of determining the nature and position of a reflective discontinuity in an optical fibre comprising coupling a semiconductor laser to one end of the fibre, directing the laser output along the fibre to obtain partial reflection at the discontinuity, directing reflected light output back into the laser to induce self-coupling, and monitoring the laser output to determine the change in lasing activity inducted by said self-coupling.

In one aspect of the invention adapted to measuring distance from the laser to a fibre end or break, the laser output has a continuous wave component and a pulse train component, the pulse repetition frequency of the pulse train being adjusted to a value at which said change in lasting activity is evidenced by change in the amplitude of an output pulse caused by coincident coupling into the laser of a preceding pulse after reflection at the end of the break. The distance from the laser to the fibre end or break is then computed from the relationship $2L=vT$ where T is the period of the applied pulse train, L is the distance from the laser to the break or fibre end, and v is the speed of light in the fibre.

Two possible techniques for detecting said change in laser activity are proposed. In the first technique laser light output power is monitored. For example, a photodetector is located so as to detect light from a reverse facet of the laser, light output being launched from and reflected back into an obverse facet of the laser. In a second technique, specifically for the coincident pulse method defined above, change in lasting activity is detected by monitoring a corresponding change in electrical power drawn by the laser, such change deriving from an alteration of threshold level of the laser.

An embodiment of the invention will now be described by way of example with reference to the accompanying drawings in which.

Figure 1:
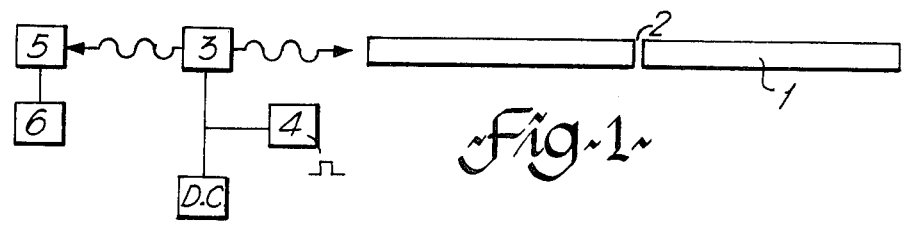
FIG. 1 shows apparatus for use in the method according to the invention in which continuous wave laser output modulated by a pulse train is used to measure fibre length.

Referring in detail to FIG. 1, there is shown an optical fibre 1 having a break 2. A semiconductor laser susceptible to self-coupling, for example, a double heterostructure GaAlAs laser, is mounted so as to direct light from one facet into the fibre 1. The laser is controlled by a dc bias to operate in a continuous wave mode. The quiescent point is indicated at Q in the graphical representation of FIG. 2. Superimposed on the continuous wave output are pulses 4 whose repetition rate can be varied. Pulses propagate along the fibre and a proportion of the light energy is reflected at the break 2. In the ideal case of a clean perpendicular break, approximately 4% of the incident light energy is internally reflected from a fibre end surface. In a practical situation, for example, breakage of a fibre in a buried fibre optic telecommunications cable, the proportion is substantially less. The reflected light propagates back along the fibre 1 and part at least is returned to the lasting cavity and can alter lasing activity within the cavity with a resulting change in the laser light output. An indication of the component of laser output derived from light coupled back into the laser is given by the broken line in the FIG. 3 graph. The graph shows a single pulse (full line) with a number of return pulses which progressively reduce in amplitude. The major return pulse corresponds to a single "round trip" of an output pulse; subsequent attenuated reflections corresponding to double and triple round trips.

The repetition frequency of pulse train 4 is adjusted until transmission of an output pulse coincides with reception of the reflected preceding output pulse. Coincidence can be monitored using a photodetector 5 and pulse height monitor 6 to detect light emanating from the reverse facet of the semiconductor laser 3. The laser output level is increased if a reflection of positive polarity is received or reduced for a reflection of negative polarity, pulse polarity being measured with respect to the quiescent continuous layer output. The length of fibre to the break can then be computed using the formula $2L=vT$ where T is the period of the applied pulse train 4; L is the length of the fibre to the break 2; and v is the speed of light in the fibre.

Care must be taken in determining fibre length by this method to ensure it is the major or initial reflection of the preceding pulse which coincides with each output pulse since harmonics of the fundamental repetition rate have a similar effect on an output pulse, ("aliasing"), and this may give an erroneous result. Thus, coincidence may occur with pulses which have undergone a plurality of round trips; alternatively only every nth output may coincide with a reflected pulse. To test for the valid pulse repetition frequency, repetition frequency is adjusted to a value at which the significant change in lasing activity is observed. This frequency is halved, then halved again, etc., monitoring throughout to ensure that the same change in lasing activity is observed at all the halved frequencies. Eventually a frequency F is obtained at which there is a decrease in the observed change in lasing activity the frequency at which the formula given previously holds is then known to be 2F.

Another aid to ensuring that the pulse repetition frequency at which coincidence occurs is the valid frequency is to extrapolate from a previously obtained signature of a fibre. In an installed fibre link there will be several locations, for example, at splices and connectors, at which a pulse propagating down the fibre will be strongly partially reflected. If a break in the fibre occurs, reflection from discontinuities beyond the break will be significantly reduced in amplitude providing a rough indication of the region in which the break has occurred and giving the order of test repetition frequency which should be applied.

Figure 2:
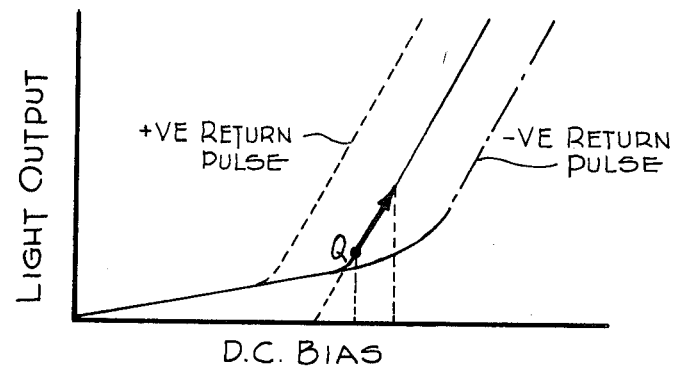
FIG. 2 is a graphical representation of alteration of laser operating characteristics which occurs using the method.
Figure 3:
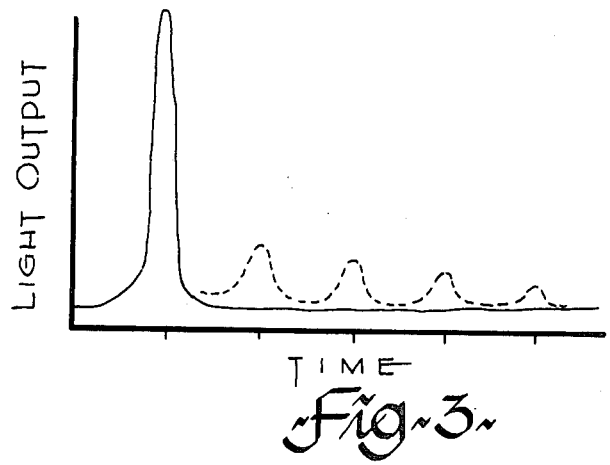
FIG. 3 is a graphical representation of the laser output with respect to time showing a self-coupling component in broken line.

If desired the photodetector 5 can be dispensed with, coincidence then being detected by monitoring the electrical power drawn by the laser. Depending upon the polarity of pulses in the pulse train 4, coincidence produces a change in the threshold level of the device which can be detected by change in power drawn. Thus as shown in FIG. 2, a positive return pulse increases lasing activity leading to a lowering of the threshold level. A negative return pulse decreases lasing activity leading to a raising of the threshold level. Operation such that the negative return pulse lowers lasing activity below threshold is preferred since corresponding changes in light output and power drawn are more readily observed.

What is claimed is:

1. A method for determining the position of a reflective discontinuity in an optical fibre comprising the steps:

applying the output of an electrical pulse generator to a semiconductor laser to generate a train of recurrent light pulses;

directing the train of recurrent light pulses into one end of the fibre;

monitoring the level of lasing activity in the laser;

varying the pulse repetition frequency of the electrical pulse generator until a frequency obtains at which light pulses self couple into the laser after reflection from the reflectivity discontinuity, the laser then undergoing a marked change in the level of changing activity owing to interference of the reflected light with light being generated within the laser;

successfully halving the pulse repetition frequency obtained;

after each frequency reduction, monitoring the level of lasing activity to determine the lowest frequency, F, at which said change in lasing activity exists; and thereby determining the distance of the reflective discontinuity from the formula $2L = vT$ where T is the period at frequency F;

v is the speed of light in the fibre; and

L is the distance between the fibre end and the reflective discontinuity.

2. A method as claimed in claim 1 in which the level of lasing activity is monitored by monitoring the peak lasing pulse output, such peak output being a function of the level of lasing activity.

3. A method as claimed in claim 1, in which the level of lasing activity is monitored by monitoring power drawn by the laser, the power drawn being a function of the level of lasing activity.

* * * * *